(12) United States Patent
Komatsuda

(10) Patent No.: US 6,781,671 B2
(45) Date of Patent: Aug. 24, 2004

(54) IMAGING OPTICAL SYSTEM AND EXPOSURE APPARATUS

(75) Inventor: Hideki Komatsuda, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/259,434

(22) Filed: Sep. 30, 2002

(65) Prior Publication Data

US 2003/0076483 A1 Apr. 24, 2003

(30) Foreign Application Priority Data

Oct. 1, 2001 (JP) ......................................... 2001-305521

(51) Int. Cl.⁷ ......................... G03B 27/54; G03B 27/42; G03B 27/32; G02B 5/08
(52) U.S. Cl. .............................. 355/67; 53/77; 359/857
(58) Field of Search ............................. 355/67, 53, 77, 355/71, 55; 362/268, 317, 341; 359/618, 619, 365, 730, 858, 859, 34, 366, 857; 250/492.2; 356/326

(56) References Cited

U.S. PATENT DOCUMENTS 5,815,310 A * 9/1998 Williamson .................. 359/365
6,426,506 B1 * 7/2002 Hudyma .................. 250/492.2

* cited by examiner

Primary Examiner—Peter B. Kim
(74) Attorney, Agent, or Firm—Finnegan, Henderson, Farabow, Garrett & Dunner, LLP

(57) ABSTRACT

An imaging optical system may be capable of forming substantially in one or more second planes one or more complete and/or partial images of one or more objects arranged substantially in one or more first planes and may comprise one or more entrance pupils, at least one of which is located substantially on an opposite side of at least one of the first plane or planes from the imaging optical system exclusive of the at least one entrance pupil so located. Such imaging optical system may be constructed so as to be substantially telecentric on at least a same side thereof as at least one of the second plane or planes. Such imaging optical system may be such that all of the reflective surface or surfaces of the imaging optical system are located in one or more spaces substantially between at least one of the first plane or planes and at least one of the second plane or planes, inclusive, and/or such imaging optical system may further comprise one or more locations disposed in one or more optical paths from at least one of the first plane or planes to at least one of the second plane or planes, inclusive, and substantially optically conjugate to at least one of the first plane or planes.

16 Claims, 7 Drawing Sheets

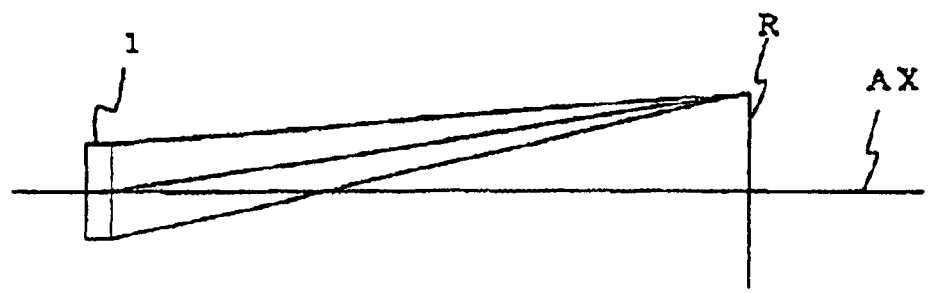
FIG. 3
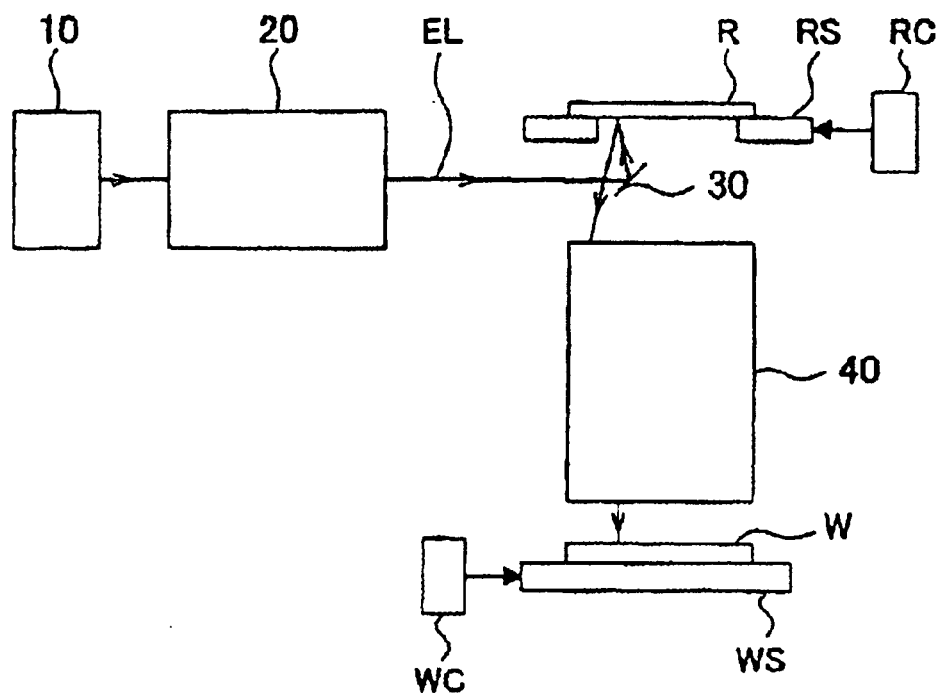
FIG. 4
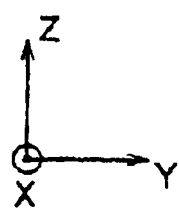

IMAGING OPTICAL SYSTEM AND EXPOSURE APPARATUS

CROSS-REFERENCE TO RELATED APPLICATION AND CLAIM OF FOREIGN PRIORITY DATE

This application claims right of benefit of prior filing date of Japanese Patent Application No. H13-305521 (2001), filed Oct. 1, 2001, entitled "Imaging Optical System and Exposure Apparatus," the content of which is incorporated herein by reference in its entirety.

DESCRIPTION OF THE INVENTION

1. Field of the Invention

The present invention pertains to an imaging optical system and exposure apparatus which may be favorably used during manufacture for example of semiconductor elements, liquid crystal display elements, image pickup elements, CCD elements, thin-film magnetic heads, and/or other such microdevices through use of photolithographic techniques.

2. Background of the Invention

Minimum linewidths in circuit patterns grow smaller with each successive generation of technology in the semiconductor and like fields of art. With each such generation of technology, greater resolving power has therefore been demanded of the exposure apparatuses used in such fields of art, and the light used for exposure (hereinafter "actinic light") has moved to shorter and shorter wavelengths. Note that except where otherwise specified, "light" and "radiation" are used interchangeably herein and without intention to limit either to wavelengths which are visible or invisible or the like, both terms being used to refer to that portion of the electromagnetic spectrum where wavelength is less than about 1 mm and in particular including a range from roughly the infrared to the x-ray region, inclusive. "Actinic" light or radiation as used herein refers to light or radiation used for exposure without regard to whether such exposure occurs by a chemical, physical, or other process. "Exposure" as used herein refers to any change due to receipt of such actinic light or radiation at the wafer or other such substrate or workpiece.

One candidate under consideration as a next-generation exposure apparatus is an EUVL (Extreme Ultra Violet Lithography) apparatus making use of EUVL technology and employing light of wavelengths on the order of 5 nm to 20 nm. Because there are no materials having transmittances that would allow adequate formation of an optical system from refractive elements at this range of wavelengths, such optical systems must be constructed exclusively from reflective surfaces. Many types of optical systems have been proposed as EUVL projection optical systems.

From the laws of physics, the limit of resolution of an exposure apparatus is given by the following formula:

(Linewidth at limit of resolution)=$k \times \lambda / NA$

... where $\lambda$ is actinic light wavelength, NA is the numerical aperture of the projection optical system, and k is a constant which depends on the characteristics of the apparatus and photosensitive resin, as well as on various other conditions. The laws of physics establish a minimum value of 0.25 for k, but practical considerations associated with actual apparatuses make 0.4 a more reasonable value for k. At present, the wavelength of light employed by most EUVL apparatuses is 13.4 nm. At the present time, EUVL apparatuses are typically contemplated for use in applications demanding minimum linewidths on the order of 50 nm. Using these values and the above formula, it can be determined that the projection optical system of an EUVL apparatus capable of achieving minimum linewidths of 50 nm should have an NA of (Required NA)>$k \times \lambda$/(minimum linewidth)=0.4×13.4/50=0.11

Moreover, to accommodate minimum linewidths of 30 nm, which represents the generation after the 50 nm minimum linewidth generation, an NA of 0.18 or higher would be required.

And yet, of the many EUVL optical systems proposed to date, there is virtually none which achieves an NA on the order of 0.1 to 0.18 over an exposure area of practical size while at the same time permitting adequate correction of aberration. This is because until recently, EUVL was only contemplated for use in applications demanding minimum linewidths of 100 nm. The recent thinking is that the 100 nm minimum linewidth generation and the 70 nm minimum linewidth generation can be accommodated by exposure technologies other than EUVL. This has consequently ratcheted forward the generation contemplated for handling using EUVL technology, but the truth of the matter is that as of the present time there are but few optical systems which have the resolving power capable of accommodating minimum linewidths of 50 nm and smaller. Of the several types of optical system proposed to date, while there are extremely few cases where aberration is adequately corrected in the context of an NA on the order of 0.1 to 0.18 in a system whose design parameters have been disclosed, some examples are disclosed at Japanese Patent Application Publication Kokai No. H10-90602 (1998) and Japanese Patent Application Publication Kokai No. H9-211332 (1997).

Now, with EUVL, because the pattern to be transferred is formed on a mask which is used in reflection, illuminating light must be incident on the mask at an oblique angle with respect thereto. This is because if illuminating light were incident perpendicularly on a reflection mask, the optical path of an illumination system which illuminates the mask and the optical path of an imaging system which is arrived at after reflection from the mask would overlap, and optical elements of the illumination system would occlude the optical path of the imaging system, and/or optical elements of the imaging system would occlude the optical path of the illumination system.

In causing a light beam to be obliquely incident thereon, both of the foregoing two patent publications disclose that the light beam be inclined in such a direction so as to cause it to be constricted as it goes from the mask surface to the projection optical system. Or stating this another way, the entrance pupil of the projection optical system is to the projection optical system side of the mask.

The basis for being able to state this in either of the foregoing two ways will be explained through use of a drawing. In a projection optical system or other such optical system without vignetting, the entrance pupil is defined as the image of the applicable aperture stop as produced by that portion of the optical system between the object surface and that aperture stop. Now, a ray passing through the center of the aperture stop is called a principal ray, and from the foregoing definition it is clear that the entrance pupil will be located at the intersection of the optical axis and an extension of a principal ray passing through the image plane. This is shown diagrammatically in FIG. 6.

FIG. 6(*a*) shows an example of a design solution in which a light beam is inclined in such direction as to cause it to be constricted with respect to the optical axis as it goes from the mask surface (object surface) to a projection optical system. In such a case, the intersection of the principal ray and the optical axis will be to the right, or to the projection lens side, of the object plane, and the entrance pupil will be to the projection optical system side of the mask plane (object plane). Conversely, in FIG. 6(b), a light beam is inclined in such direction as to cause it to diverge with respect to the optical axis as it goes from the mask surface (object surface) to the projection optical system, in which case the intersection of the principal ray and the optical axis will be to the left, or on the side opposite the projection lens side, of the object plane, and the entrance pupil will be on the side opposite the projection optical system side of the mask plane (object plane).

The former situation (i.e., a situation such as that shown in FIG. 6(a)) creates the following difficulties from the standpoint of illumination optical system design. For efficient, distortion-free transfer of the mask pattern to the surface being exposed it is, in general, required that the exit pupil of the illumination optical system be conjugate to the entrance pupil of the projection optical system. The location of the entrance pupil of the projection optical system must therefore be taken into consideration during illumination optical system design. FIG. 5(a) and (b) show schematic diagrams of illumination systems designed, respectively, for the situation where the entrance pupil of the projection optical system is located to the projection optical system side of the mask plane and for the situation where the entrance pupil of the projection optical system is located to the illumination system side of the mask plane. FIG. 5(a) and (b) both show the optical path of a light beam which exits a light source 1 and is reflected from a reflective optical system 2 to illuminate a mask 3. Here, AX indicates the optical axis.

As is clear from FIG. 5(a), when the entrance pupil of the projection optical system is located to the projection optical system side of the mask plane, a light beam directed toward reflective optical system 2 from light source 1 will approach a light beam reflected from reflective optical system 2 and directed toward mask 3. Such beams may even overlap in some cases, and isolation of the beams is difficult. On the other hand, as is clear from FIG. 5(b), when the entrance pupil of the projection optical system is located to the illumination system side of the mask plane, there is less opportunity for such overlapping of light beams, facilitating isolation of light beams. Based on the foregoing, it is clear that a design locating the entrance pupil of the projection optical system to the projection optical system side of the mask plane will have the disadvantage that illumination system design will be difficult.

Problems arising when known illumination systems are combined with projection optical systems described in the foregoing two patent publications will now be explained. Among the various types of EUVL illumination systems proposed to date, a system described in a paper entitled "High-Efficiency Condenser Design for Illuminating a Ring Field" by William C. Sweatt (OSA Proceedings on Soft X-Ray Projection Lithography Vol. 18, 1993) is typical of those under consideration in the U.S. Furthermore, a system which has recently received considerable attention was introduced in a paper entitled "A Novel Condenser for EUV Lithography Ring-Field Projection Optics" by Henry N. Chapman and Keith A. Nugent (part of the SPIE Conference on EUV, X-Ray, and Neutron Optics and Sources, Proceedings of SPIE Vol. 3767, July 1999).

In these illumination systems, the exit pupil of the illumination system is located to the illumination system side of the mask plane. In the projection optical systems described in the foregoing two patent publications, the entrance pupil of the projection optical system is to the projection optical system side of the mask. Some optical means is therefore required to make the exit pupil of the illumination system conjugate to the entrance pupil of the projection optical system. In the illumination systems of the foregoing papers, a spheroidal mirror arranged immediately in front of the mask serves as such optical means.

However, a spheroidal mirror is an optical element that, while completely aberration-free with respect to imaging between the two foci thereof, nonetheless produces an extremely large amount of aberration for imaging between a point even slightly removed from a focus thereof and a point conjugate thereto. While this would present no problem for a theoretical point light source, real light sources will, in general, have some extension in space. Such method therefore causes introduction of distortion in the illuminating light, distorting the image of the light source formed at the pupil of the projection optical system and making distortion-free transfer of the mask pattern to the surface being exposed difficult.

SUMMARY OF THE INVENTION

The present invention was conceived in light of such problems and has as its object the provision of an imaging optical system and exposure apparatus which are not difficult to design, which permit sufficiently large NA as well as satisfactory correction of aberration, and which, when combined with an illumination system, permit establishment of a conjugate relationship between the exit pupil of the illumination system and the entrance pupil of the projection optical system.

As described in further detail below, the present invention permits an imaging optical system to be provided which has sufficiently high numerical aperture and which permits satisfactory correction of aberration. Furthermore, when used in combination with illumination systems, the present invention permits an imaging optical system to be provided which facilitates illumination system design, making it possible to ensure that exit pupils of illumination systems are made conjugate to entrance pupils of projection optical systems without the need to employ special optical means. Moreover, when such imaging optical systems are used to carry out exposure, the present invention permits an exposure apparatus to be provided which is capable of projecting images of extremely detailed patterns onto substrates at high resolution. It should be noted that while the plural form of certain elements is used in this disclosure, the present invention may also use the singular form of an element. For example, there may be only one exit pupil or one entrance pupil.

In order to solve one or more of the foregoing problems and/or achieve one or more of the foregoing objects, an imaging optical system in accordance with a first aspect of the present invention, in the context of a catoptric imaging optical system capable of forming substantially in one or more second planes one or more complete and/or partial images of one or more objects substantially in one or more first planes, is characterized in that the system has at least one species selected from among the group consisting of one or more entrance pupils, at least one of which is located substantially on an opposite side of at least one of the first plane or planes from the imaging optical system exclusive of the at least one entrance pupil so located. The optical system further has one or more exit pupils, at least one of which is located substantially on an opposite side of at least one of the second plane or planes from the imaging optical system exclusive of the at least one exit pupil so located.

Here, because the first and second planes are conjugate with respect to each other, it is possible to exchange object planes and image planes, in which case the foregoing is equivalent to saying that complete and/or partial images of objects substantially in second planes may be formed substantially in first planes. In the event that second planes are thus taken to be object planes, the foregoing "one or more exit pupils, at least one of which is located substantially on an opposite side of at least one of the second plane or planes from the imaging optical system exclusive of the at least one exit pupil so located" is equivalent to one or more entrance pupils, at least one of which is located substantially on an opposite side of at least one of the second plane or planes from the imaging optical system exclusive of the at least one entrance pupil so located.

If such an imaging optical system is used as a projection optical system in combination with at least one illumination system having at least one exit pupil to the illumination system side of at least one plane being illuminated, in order to make the exit pupil of the at least one illumination system conjugate to the entrance pupil of the projection optical system, it is sufficient to simply locate the entrance pupil of the projection optical system, such that it is coincident with the exit pupil of the illumination system. One or more embodiments of the present invention may thus make it possible to dispense with special optical means such as a spheroidal mirror, and may moreover permit avoidance of problems attendant upon use of such optical means.

An imaging optical system in accordance with a second aspect of the present invention, in the context of a catoptric imaging optical system capable of forming substantially in one or more second planes one or more complete and/or partial images of one or more objects substantially in one or more first planes, is characterized in that the system has one or more entrance pupils. At least one of the entrance pupils is located substantially on an opposite side of at least one of the first plane or planes from the imaging optical system exclusive of the at least one entrance pupil so located. The imaging optical system is substantially telecentric on at least a same side thereof as at least one of the second plane or planes.

If such an imaging optical system is used as projection optical system in an exposure apparatus in combination with at least one illumination system having at least one exit pupil to the illumination system side of at least one plane being illuminated, in order to make the exit pupil of the at least one illumination system conjugate to the entrance pupil of the projection optical system, it is sufficient to simply locate the entrance pupil of the projection optical system such that it is coincident with the exit pupil of the illumination system. One or more embodiments of the present invention may thus make it possible to dispense with special optical means such as a spheroidal mirror, and may moreover permit avoidance of problems attendant upon use of such optical means. In addition, by making the system telecentric on the second plane side, because the size of the circuit pattern or the like being projected will remain unchanged despite change in focus positioning of planes of exposure and/or projection optical systems, this may be favorably employed in an exposure apparatus.

An imaging optical system in accordance with a third aspect of the present invention, in the context of a catoptric imaging optical system capable of forming substantially in one or more second planes one or more complete and/or partial images of one or more objects substantially in one or more first planes, is characterized in that the system includes one or more exit pupils. At least one of the exit pupils is located substantially on an opposite side of at least one of the second plane or planes from the imaging optical system exclusive of the at least one exit pupil so located. The imaging optical system being substantially telecentric on at least a same side thereof as at least one of the first plane or planes. In such constitution, exchanging object side and image side of the imaging optical system permits attainment of action and benefit similar to those attained in the imaging optical system in accordance with the second aspect of the present invention.

An imaging optical system in accordance with a fourth aspect of the present invention, in the context of an imaging optical system according to any one of the first through third aspects of the present invention, is characterized in that it further includes one or more locations disposed in one or more optical paths from at least one of the first plane or planes to at least one of the second plane or planes, inclusive, and substantially optically conjugate to at least one of the first plane or planes. Employment of an optical system of this type facilitates attainment of optical system designs having image-side NAs of 0.11 or higher.

An imaging optical system in accordance with a fifth aspect of the present invention, in the context of an imaging optical system according to any one of the first through fourth aspects of the present invention, is characterized in that all of the reflective surface or surfaces of the imaging optical system are located in one or more spaces substantially between at least one of the first plane or planes and at least one of the second plane or planes, inclusive. Such constitution permits prevention of complicated optical system designs and of increases in size of the apparatus, and permits facilitation of optical system adjustment and of manufacture of an apparatus employing such optical system.

An exposure apparatus in accordance with a sixth aspect of the present invention is characterized in that it includes one or more imaging optical systems according to any one of the first through fifth aspects of the present invention arranged substantially in one or more optical paths substantially between at least one of the first plane or planes and at least one of the second plane or planes, inclusive. The exposure apparatus is capable of transferring to one or more photosensitive substrates, arranged substantially in at least one of the second plane or planes, one or more complete and/or partial images of one or more prescribed patterns formed on one or more masks arranged substantially in at least one of the first plane or planes. The apparatus further has one or more radiation sources, and one or more illumination optical systems arranged substantially in one or more optical paths between at least one of the radiation sources and at least one of the first plane or planes, inclusive, and capable of illuminating at least one of the mask or masks.

Furthermore, the present invention, in the context of an imaging optical system capable of forming substantially in one or more second planes one or more complete and/or partial images of one or more objects arranged substantially in one or more first planes from at least a portion of light reflected from at least one of the first plane or planes, is characterized in that the system comprises one or more entrance pupils, at least one of which is located substantially on an opposite side of at least one of the first plane or planes from the imaging optical system exclusive of the at least one entrance pupil so located. In such a constitution it is preferred that the imaging optical system be constructed so as to be substantially telecentric on at least a same side thereof as at least one of the second plane or planes. In addition, it is preferred that the imaging optical system have a reducing magnification (i.e., have magnification less than unity).

Furthermore, the present invention, in the context of an exposure method for using one or more imaging optical systems according to the first aspect of the present invention to transfer to one or more photosensitive substrates arranged substantially in at least one of the second plane or planes one or more complete and/or partial images of one or more prescribed patterns formed on one or more masks arranged substantially in at least one of the first plane or planes, is a method including an operation wherein radiation is supplied. The method further includes an operation wherein at least one of the mask or masks is illuminated with at least a portion of the supplied radiation, and an operation wherein at least one of the imaging optical system or systems is used to form on at least one of the photosensitive substrate or substrates at least one of the complete and/or partial image or images.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 3 is a drawing of components in an illumination system capable of being combined with an imaging optical system in accordance with working examples of the present invention;

FIG. 4 is a drawing of a schematic representation of the overall constitution of an exposure apparatus associated with an embodiment of the present invention;

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
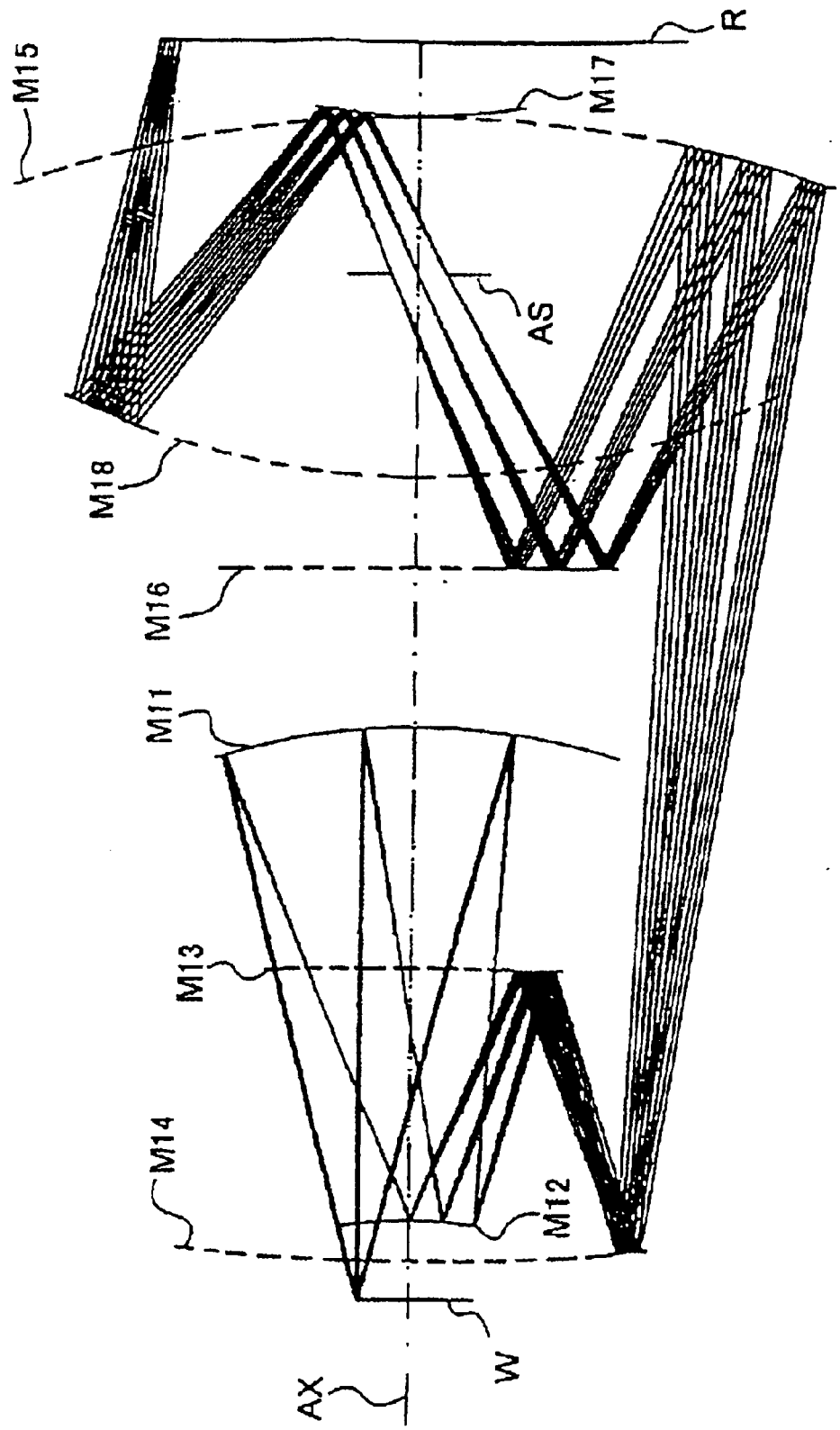
FIG. 1 is a sectional diagram of components in an imaging optical system associated with a first working example of the present invention.

FIG. 1 is a sectional diagram showing components in an imaging optical system associated with a first working example of the present invention. The present imaging optical system forms on wafer W a reduced image of a circuit pattern present on reticle R serving as mask. The present imaging optical system has an entrance pupil which is located on the opposite side of reticle R from the present imaging optical system exclusive of same entrance pupil. Furthermore, the present imaging optical system has at least one location which is disposed in the optical path from reticle R to wafer W and which is conjugate to reticle R.

As shown in FIG. 1, the present imaging optical system has 8 reflective surfaces, these reflective surfaces being arranged in the space from reticle R to wafer W. In FIG. 1, wafer W is arranged to the left and reticle R is arranged to the right, with the reflective surfaces being respectively labeled, in order along the optical path from wafer W to reticle R: M11, M12, M13, M14, M15, M16, M17, and M18. All of the reflective surfaces are arranged along a common optical axis AX. Stop surface AS is arranged in the optical path between reflective surface M16 and reflective surface M17. An intermediate image of reticle R is formed at or near reflective surface M14.

Representative design values for the present imaging optical system are presented, in order from the wafer W side to the reticle R side, in TABLE 1. At TABLE 1, the surfaces M11 through M18 and AS correspond to the elements so labeled in FIG. 1. At TABLE 1, NA indicates wafer-side numerical aperture and IH indicates image height at wafer W. Optical dimensions presented herein are in general scaleable, but if the radii of curvature and distances between surfaces presented at TABLE 1 are, for the sake of illustration, representatively understood to be in units of millimeters, then the image heights and entrance pupil positions given here will likewise be in units of millimeters. But it should be understood that the optical design principles of the present invention and the beneficial effects produced thereby are not in general limited to any particular choice of unit, nor should the present invention be interpreted as being limited to any such unit which is presented herein only for representative, descriptive, or exemplary purposes. The same applies to the units of values in any further working examples presented below.

TABLE 1

| | NA = 0.25 IH = 25–27 | | | | |
|---|---|---|---|---|---|
| Surface | | Radius of Curvature | | Distance to Next Surface | |
| Wafer W | | 0 | | 296.903717 | |
| M11 | | −311.54638 | | −255.024733 | |
| A: | −0.248244 E−09 | B: | −0.298817 E−14 | C: | −0.360319 E−19 |

TABLE 1-continued

NA = 0.25 IH = 25–27

| Surface | | Radius of Curvature | | Distance to Next Surface | |
|---|---|---|---|---|---|
| D: | 0.157508 E−24 | E: | −.327672 E−28 | F: | 0.684088 E−33 |
| M12 | | | −206.49710 | | 129.491954794 |
| A: | −0.904159 E−07 | B: | −0.221076 E−11 | C: | −0.464742 E−15 |
| D: | −0.190901 E−19 | E: | −0.419997 E−25 | F: | −0.732471 E−28 |
| M13 | | | −1684.21756 | | −150.418012 |
| A: | 0.247574 E−07 | B: | 0.137345 E−11 | C: | −0.265235 E−15 |
| D: | 0.263453 E−19 | E: | −0.462924 E−24 | F: | −0.243337 E−28 |
| M14 | | | 1313.67303 | | 591.503376 |
| A: | 0.573782 E−08 | B: | −0.196972 E−12 | C: | 0.281235 E−17 |
| D: | 0.823798 E−21 | E: | −0.558484 E−25 | F: | 0.112836 E−29 |
| M15 | | | −606.59969 | | −233.955158 |
| A: | 0.402770 E−09 | B: | 0.323270 E−14 | C: | −0.362003 E−21 |
| D: | 0.376819 E−24 | E: | −0.285846 E−29 | F: | 0.273364 E−34 |
| M16 | | | −5377.98548 | | 153.150242 |
| A: | 0.656752 E−08 | B: | −0.317418 E−13 | C: | −0.122131 E−18 |
| D: | 0.239295 E−22 | E: | 0.100524 E−27 | F: | −0.303088 E−31 |
| AS | | | 0 | | 81.382317 |
| M17 | | | 294.34527 | | −187.152779 |
| A: | −0.679143 E−07 | B: | 0.470198 E−12 | C: | 0.294531 E−15 |
| D: | −0.500400 E−19 | E: | 0.817101 E−24 | F: | 0.402402 E−27 |
| M18 | | | 422.14148 | | 224.663737 |
| A: | 0.121838 E−08 | B: | 0.338973 E−14 | C: | 0.225824 E−18 |
| D: | −0.825559 E−23 | E: | 0.154881 E−27 | F: | −0.947192 E−33 |

At TABLE 1, A through F are aspheric coefficients for the surface in question. The meanings of the various coefficients are as defined by the following formula.

$$Z = \frac{h^2}{r\{1 + \sqrt{1 - h^2/r^2}\}} + Ah^4 + Bh^6 + Ch^8 + Dh^{10} + Eh^{12} + Fh^{14}$$

FORMULA 1 where h is height measured perpendicular to the optical axis, Z(h) is distance along the optical axis from a plane tangent to the vertex of the asphere to a location on the asphere at height h (i.e., sag), and r is radius of curvature of the surface in question. The symbols used in any further working examples presented below follow the same conventions as established in the present working example.

The present working example permits attainment of an optical system having a numerical aperture as large as NA=0.25. Furthermore, the present working example has an entrance pupil which is located at 802.0197 as measured from the reticle, this location being on the opposite side of the reticle R from the present imaging optical system exclusive of the same entrance pupil.

Figure 2:
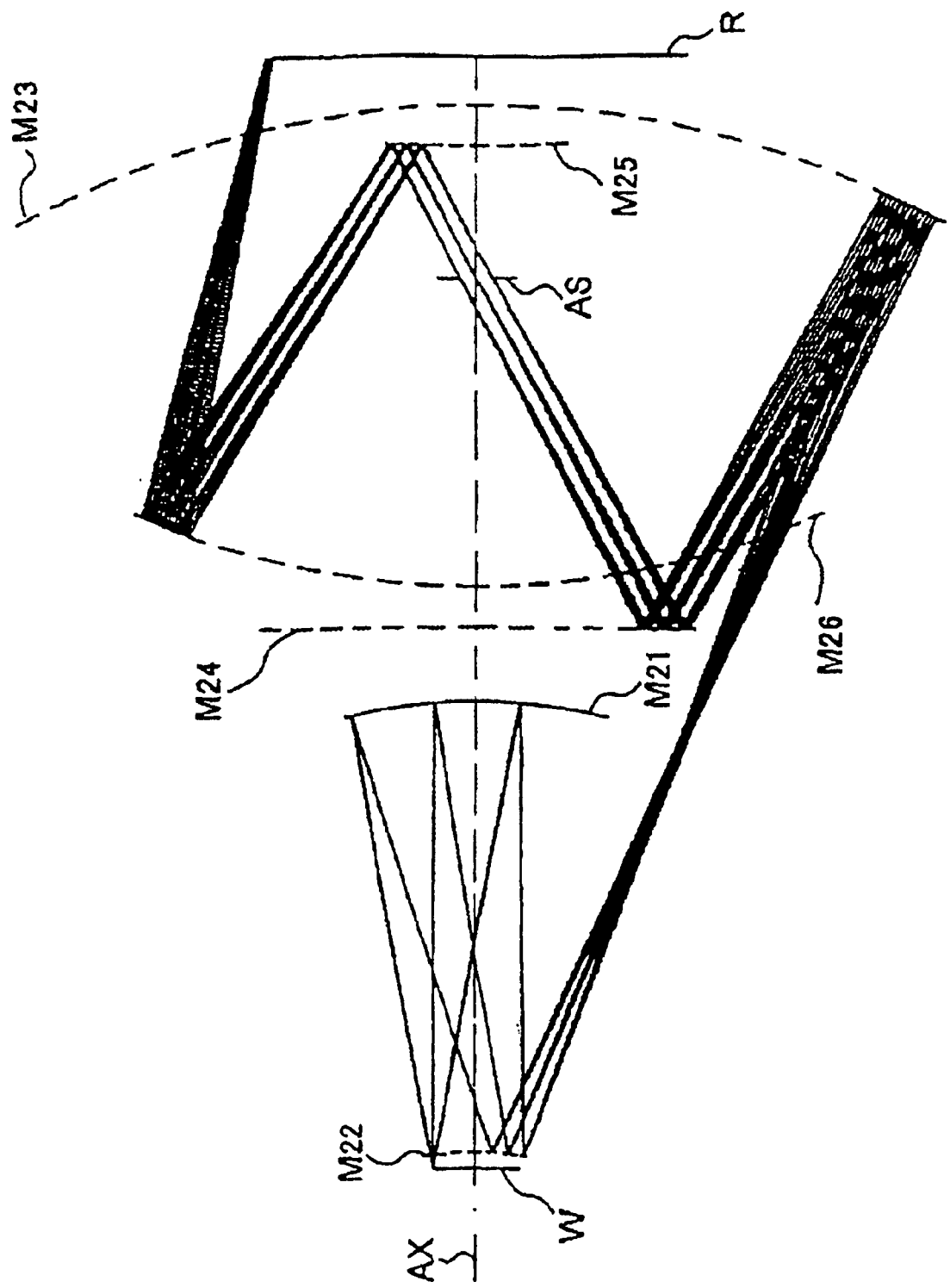
FIG. 2 is a sectional diagram of components in an imaging optical system associated with a second working example of the present invention.

FIG. 2 is a sectional diagram showing components in an imaging optical system associated with a second working example of the present invention. The present imaging optical system forms on wafer W a reduced image of a circuit pattern present on reticle R. The present imaging optical system has an entrance pupil which is located on the opposite side of reticle R from the present imaging optical system exclusive of same entrance pupil. Furthermore, the present imaging optical system has at least one location which is disposed in the optical path from reticle R to wafer W and which is conjugate to reticle R.

As shown in FIG. 2, the present imaging optical system has 6 reflective surfaces, these reflective surfaces being arranged in the space from reticle R to wafer W. In FIG. 2, wafer W is arranged to the left and reticle R is arranged to the right, with the reflective surfaces being respectively labeled, in order along the optical path from wafer W to reticle R: M21, M22, M23, M24, M25, and M26. All of the reflective surfaces are arranged along a common optical axis AX. Stop surface AS is arranged in the optical path between reflective surface M24 and reflective surface M25. An intermediate image of reticle R is formed in the optical path between reflective surface M22 and reflective surface M23. Representative design values for the present imaging optical system are presented, in order from the wafer W side to the reticle R side, in TABLE 2. At TABLE 2, the surfaces M21 through M26 and AS correspond to the elements so labeled in FIG. 2.

TABLE 2

NA = 0.18 IH = 25.5–26.5

| Surface | | Radius of Curvature | | Distance to Next Surface | |
|---|---|---|---|---|---|
| Wafer W | | | 0 | | 296.903717 |
| M21 | | | −319.66775 | | −283.187709 |
| A: | −0.187070 E−09 | B: | −0.233064 E−14 | C: | 0.110185 E−19 |
| D: | −0.749844 E−23 | E: | 0.747032 E−27 | F: | −0.307286 E−31 |
| M22 | | | −187.43327 | | 656.209306 |
| A: | −0.109730 E−06 | B: | −0.893385 E−11 | C: | −0.346664 E−14 |
| D: | 0.191182 E−17 | E: | −.862173 E−21 | F: | 0.143507 E−24 |
| M23 | | | −606.20624 | | −327.526331 |

TABLE 2-continued

NA = 0.18 IH = 25.5–26.5

| Surface | | Radius of Curvature | | Distance to Next Surface |
|---|---|---|---|---|
| A: −0.962353 E−10 | B: | 0.241327 E−14 | C: | −0.208148 E−19 |
| D: 0.822439 E−25 | E: | 0.444437 E−30 | F: | −0.216186 E−35 |
| M24 | | −4429.67855 | | 219.955682 |
| A: 0.158366 E−08 | B: | 0.166816 E−13 | C: | −0.134031 E−17 |
| D: 0.865661 E−22 | E: | −0.272114 E−26 | F: | 0.325044 E−31 |
| AS | | 0 | | 82.484827 |
| M25 | | 1082.20006 | | −276.322317 |
| A: −0.287234 E−08 | B: | −0.835028 E−14 | C: | −0.545944 E−16 |
| D: −0.231594 E−19 | E: | 0.102226 E−22 | F: | −0.103655 E−26 |
| M26 | | 527.54455 | | 331.408140 |
| A: 0.217398 E−09 | B: | 0.470303 E−14 | C: | −0.645543 E−20 |
| D: −0.678925 E−24 | E: | 0.963959 E−29 | F: | −0.329336 E−34 |

The present working example permits attainment of an optical system having a numerical aperture as large as NA=0.18. Furthermore, the present working example has an entrance pupil which is located at 598.457912 as measured from the reticle, this location being on the opposite side of the reticle R from the present imaging optical system exclusive of same entrance pupil.

The imaging optical systems associated with the foregoing Working Examples 1 and 2 each have an NA of 0.18 or higher. This represents a large numerical aperture as compared with conventional imaging optical systems of similar type, permitting attainment of high resolving power. As a result, foregoing imaging optical systems may be employed not only in exposure apparatuses for present-day applications where minimum linewidths of 50 nm are demanded, but also in next-generation exposure apparatuses where minimum linewidths of 30 nm are demanded.

Figure 5:
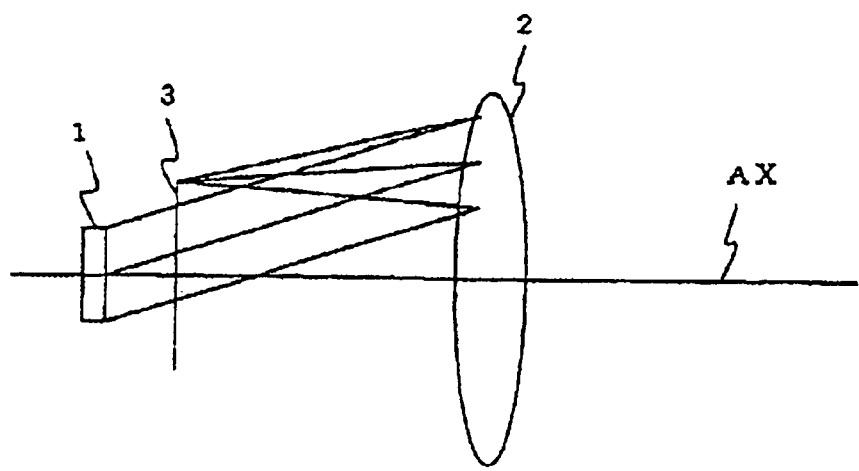
FIG. 5(a) contains a schematic diagram of the effect of illumination system exit pupil location on light beams.
FIG. 5(b) contains a schematic diagram of the effect of illumination system exit pupil location on light beams.
Figure 5:
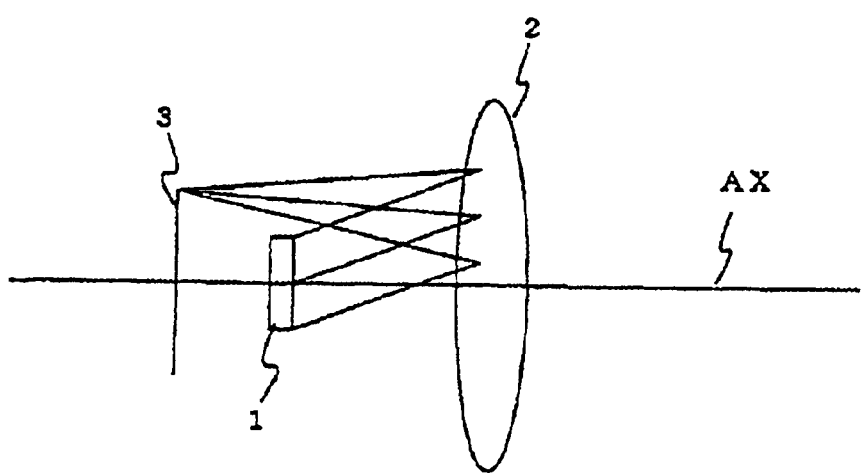
Figure 6:
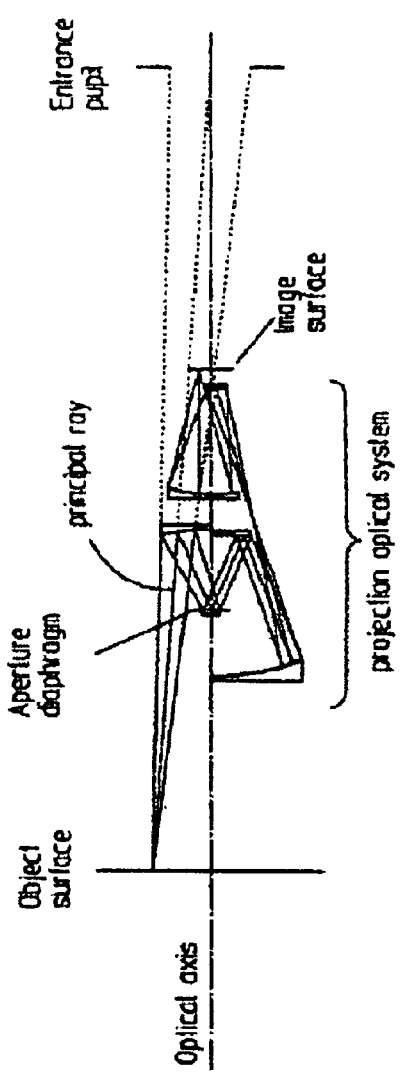
FIG. 6(a) contains a schematic diagram of the effect of illumination system entrance pupil location on light beams.
FIG. 6(b) contains a schematic diagram of the effect of illumination system entrance pupil location on light beams.
FIG. 6(c) contains a schematic diagram of the effect of illumination system exit pupil location on light beams.
Figure 6:
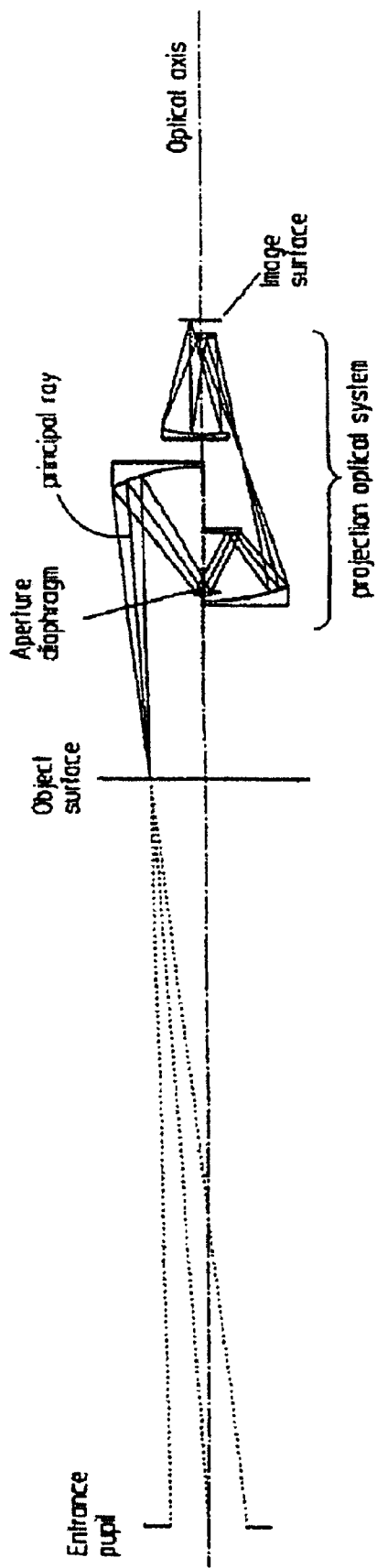
Figure 6:
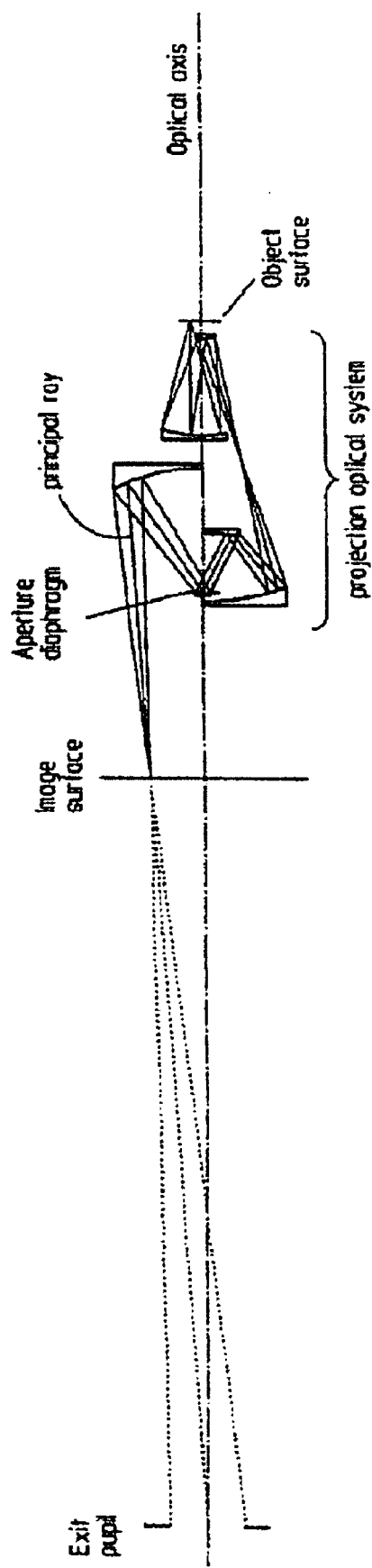
Figure 7:
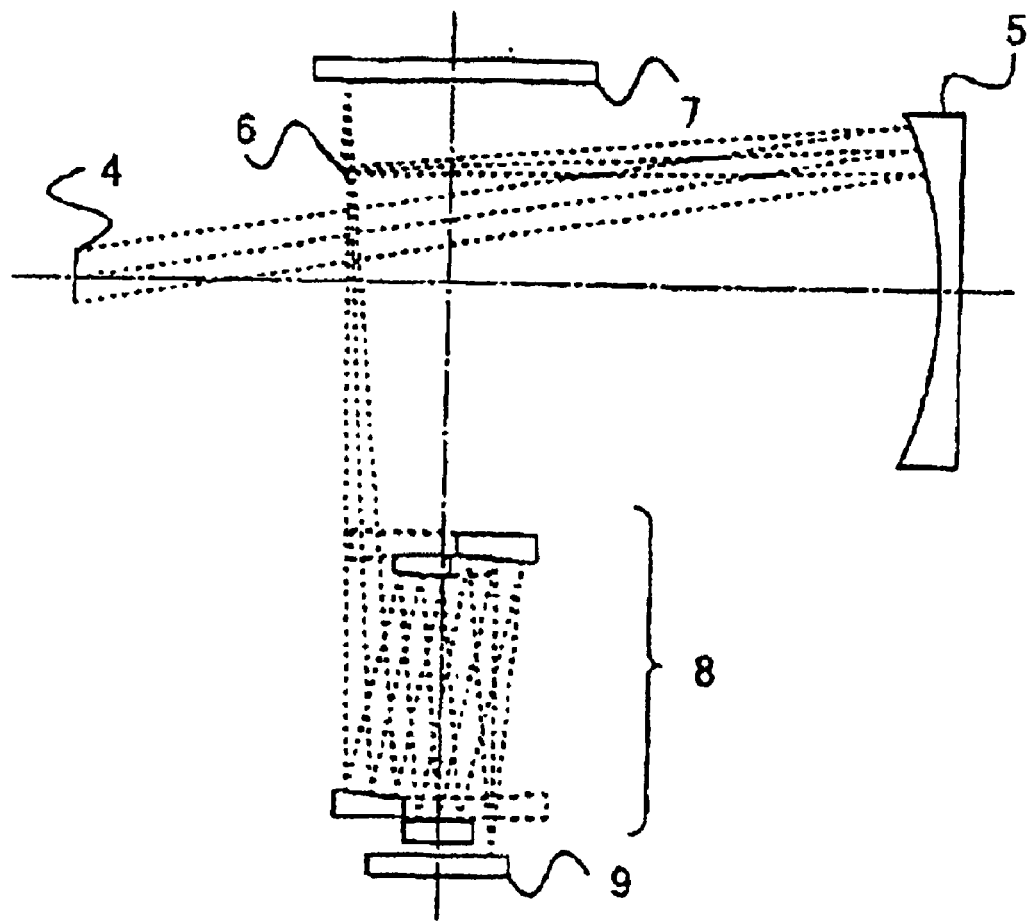
FIG. 7 is a drawing of a components in conventional exposure apparatuses.

Furthermore, the imaging optical systems associated with the foregoing Working Examples 1 and 2 each have an entrance pupil which is located at the opposite side of the reticle R from the imaging optical system exclusive of the entrance pupil. If one or more such imaging optical systems are used in combination with illumination systems it will therefore be possible to achieve illumination systems such as that shown schematically in FIG. 5(b), facilitating isolation of light beams. Moreover, in making exit pupils of illumination systems conjugate to entrance pupils of projection optical systems, because there is no need to employ special optical means and it is sufficient to simply locate entrance pupils of projection optical systems so as to be coincident with exit pupils of illumination systems, such design is extremely simple. Design of illumination systems in combination therewith thus becomes a very easy matter. Because there is therefore no need to employ a spheroidal mirror or other such special optical means such as was used conventionally, it is possible to avoid problems attendant upon use of such optical means.

In particular, imaging optical systems in accordance with the foregoing working examples may be combined with illumination systems such as that shown in FIG. 3. In this illumination system, light source 1 may also function as collector. A light beam emitted from light source 1 may illuminate reticle R directly, without intervention of other elements therebetween. As means for imparting such light-collecting function, a fly's eye lens may, for example, be employed. Isolation of light beams is further facilitated with an illumination system having such a design. Furthermore, as this permits elimination of at least one reflective surface at the illumination system, increase in exposure dose can be expected.

The present working example permits use in combination with illumination systems having such significant advantages. Optical systems in which the entrance pupil is located on the same side of the reticle R as the imaging optical system exclusive of the entrance pupil, such as is the case with conventional imaging optical systems, do not, however, in general admit of use in combination with such illumination systems.

Below, an exposure apparatus employing a projection optical system applying an imaging optical system in accordance with one or more working examples of the present invention is described. FIG. 4 is a drawing showing a schematic representation of the overall constitution of such an exposure apparatus. Description referring to FIG. 4 is made with respect to a Z axis taken to be in the direction in which projection optical system 40 projects light onto wafer W, a Y axis in a plane perpendicular to the Z axis and in the plane of the paper at FIG. 4, and an X axis in a plane perpendicular to the Z axis and perpendicular to the plane of the paper at FIG. 4.

Light source 10 may emit light in the EUV, e.g., of wavelength 13.4 nm and/or 11.5 nm. Light EL emitted by light source 10 may travel by way of illumination optical system 20 to be deflected by plane reflector 30, following which it may illuminate reticle R, on which a prescribed pattern may be formed. Reticle R may be held by reticle stage RS so as to be parallel to the XY plane. Reticle stage RS, if present, may be capable of movement in two dimensions in substantially parallel fashion with respect to the XY plane, the magnitude of such movement being capable of being controlled by reticle stage controller RC.

Reticle R may be arranged in an object plane of projection optical system 40, and wafer W, coated with photoresist and serving as substrate, may be arranged in an image plane of projection optical system 40. Light reflected from reticle R may travel by way of projection optical system 40 to form on wafer W, serving as photosensitive substrate, a reduced image of a mask pattern. Here, the entrance pupil of projection optical system 40 and the exit pupil of illumination optical system 20 may be located on the same side of reticle R as the illumination optical system exclusive of its exit pupil, the respective optical systems being arranged such that these two pupils coincide. Projection optical system 40 may be constituted so as to be substantially telecentric at the wafer W side thereof.

Wafer W may be held by wafer stage WS so as to be parallel to the XY plane. Wafer stage WS, if present, may be capable of movement in the XY plane and in the Z direction, the magnitude of such movement being capable of being controlled by wafer stage controller WC. In addition, reticle stage RS and wafer stage WS, and therefore reticle R and wafer W, may be made to move in synchronous fashion (i.e., be made to scan) in a direction parallel, for example, to the Y direction. This will permit the mask pattern to be scanned across wafer W, exposing wafer W, as a result of which the circuit pattern on reticle R may be transferred to a plurality of regions on wafer W corresponding to step-and-scan "steps."

Whereas several preferred embodiments of the present invention and variations thereof have been described above, these examples have been presented merely for purposes of describing the invention and it is not intended that the invention should be limited thereto. The present invention may be carried out in the context of a wide variety of modes and embodiments other than those specifically presented herein.

For example, the present invention may be applied not only to exposure apparatuses used for manufacture of semiconductor devices, but also to exposure apparatuses capable of transferring a device pattern to a glass plate such as those used for manufacture of display devices comprising liquid crystal elements or the like, exposure apparatuses capable of transferring a device pattern to a ceramic wafer such as those used for manufacture of thin-film magnetic heads, exposure apparatuses used for manufacture of image pickup elements (CCDs, etc.), and so forth. Moreover, the present invention may also be applied to exposure apparatuses capable of transferring a circuit pattern to a glass substrate, silicon wafer, or the like for manufacture of reticles or masks.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A catoptric imaging optical system having reflective surfaces capable of forming substantially in a second plane image of an object substantially in a first plane, the system comprising:
    an entrance pupil located substantially on an opposite side of the first plane from the imaging optical system, and
    an exit pupil located substantially on an opposite side of the second plane from the imaging optical system.

2. The imaging optical system of claim 1 further comprising a location disposed in an optical path from the first plane to the second plane, inclusive; and substantially optically conjugate to the first plane.

3. The imaging optical system of claim 1 wherein the reflective surfaces of the imaging optical system are located in a space substantially between the first plane and the second plane, inclusive.

4. A catoptric imaging optical system capable of forming substantially in a second plane an image of an object substantially in a first plane, the system comprising:
    the imaging optical system including an entrance pupil located substantially on an opposite side of the first plane from the imaging optical system;
    the imaging optical system being substantially telecentric on at least a same side thereof as the second plane.

5. An exposure method for using an imaging optical system to transfer to a photosensitive substrate arranged substantially in a second plane an image of a prescribed pattern formed on a mask arranged substantially in a first plane, the method comprising:
    an operation wherein radiation is supplied;
    an operation wherein the mask is illuminated with the supplied radiation: and
    an operation wherein the imaging optical system of claim 4 is used to form on the photosensitive substrate the image.

6. A catoptric imaging optical system capable of forming substantially in a second plane an image of an object substantially in a first plane, the system comprising:
    the imaging optical system including an exit pupil located substantially on an opposite side of the second plane from the imaging optical system;
    the imaging optical system being substantially telecentric on at least a same side thereof as the first plane.

7. An exposure method for using an imaging optical system to transfer to a photosensitive substrate arranged substantially in a second plane an image of a prescribed pattern formed on a mask arranged substantially in a first plane, the method comprising:
    an operation wherein radiation is supplied;
    an operation wherein the mask is illuminated with the supplied radiation; and
    an operation wherein the imaging optical system of claim 6 is used to form on the photosensitive substrate the image.

8. An exposure apparatus comprising:
    a catoptric imaging optical system having reflective surfaces, the imaging optical systems being capable of forming substantially in a second plane an image of an object substantially in a first plane, the imaging optical system comprising an entrance pupil located substantially on an opposite side of the first plane from the imaging optical system the, and an exit pupil located substantially on an opposite side of the second plane from the imaging optical system; the imaging optical system arranged substantially in an optical path substantially between the first plane the second plane, inclusive, and capable of transferring to a photosensitive substrate arranged substantially in the second plane the image of a prescribed pattern formed on a mask arranged substantially in the first plane;
    a radiation source; and
    an illumination optical system arranged substantially in an optical path between the radiation source and the first plane, inclusive, and capable of illuminating the mask.

9. The exposure apparatus of claim 8 wherein the imaging optical system further comprises a location disposed in the optical path from the first plane to the second plane, inclusive; and substantially optically conjugate to the first plane.

10. The exposure apparatus of claim 8 wherein the reflective surfaces of the imaging optical system are located in a space substantially between the first plane and the second plane, inclusive.

11. An exposure method for using an imaging optical system to transfer to a photosensitive substrate arranged substantially in a second plane an image of a prescribed pattern formed on a mask arranged substantially in a first plane, the method comprising:
    an operation wherein radiation is supplied;
    an operation wherein the mask is illuminated with the supplied radiation; and
    an operation wherein the imaging optical system of claim 8 is used to form on the photosensitive substrate the image.

12. An exposure apparatus comprising:
    a catoptric imaging optical system capable of forming substantially in a second plane an image of an object substantially in a first plane, the imaging optical system comprising an entrance pupil located substantially on an opposite side of the first plane from the imaging optical system, the imaging optical system being substantially telecentric on at least a same side thereof as the second plane;

a radiation source; and an illumination optical system arranged substantially in an optical path between the radiation source and the first plane, inclusive, and capable of illuminating the object.

13. An exposure method for using an imaging optical system to transfer to a photosensitive substrate arranged substantially in a second plane an image of a prescribed pattern formed on a mask arranged substantially in a first plane, the method comprising:

an operation wherein radiation is supplied;

an operation wherein the mask is illuminated with the supplied radiation; and an operation wherein the imaging optical system of claim 12 is used to form on the photosensitive substrate the image.

14. An exposure apparatus comprising:

a catoptric imaging optical system capable of forming substantially in a second plane an image of an object substantially in a first plane, the imaging optical system comprising am exit pupil located substantially on an opposite side of the second plane from the imaging optical system;

the imaging optical system being substantially telecentric on at least a same side thereof as the first plane;

a radiation source; and an illumination optical system arranged substantially in an optical path between the radiation source and the first plane, inclusive, and capable of illuminating the object.

15. An exposure method for using an imaging optical system to transfer to a photosensitive substrate arranged substantially in a second plane an image of a prescribed pattern formed on a mask arranged substantially in a first plane, the method comprising:

an operation wherein radiation is supplied;

an operation wherein the mask is illuminated with the supplied radiation; and an operation wherein the imaging optical system of claim 14 is used to form on the photosensitive substrate the image.

16. An exposure method for using an imaging optical system to transfer to a photosensitive substrate arranged substantially in a second plane an image of a prescribed pattern formed on a mask arranged substantially in a first plane, the method comprising:

an operation wherein radiation is supplied;

an operation wherein the mask is illuminated with the supplied radiation; and an operation wherein the imaging optical system of claim 1 is used to form on the photosensitive substrate the image.

* * * * *

UNITED STATES PATENT AND TRADEMARK OFFICE
CERTIFICATE OF CORRECTION

PATENT NO. : 6,781,671 B2
DATED : August 24, 2004
INVENTOR(S) : Hideki Komatsuda It is certified that error appears in the above-identified patent and that said Letters Patent is hereby corrected as shown below:

<u>Column 14,</u>
Line 2, "radiation:" should read -- radiation; --.
Line 33, "system the," should read -- system, --.
Line 37, "plane the" should read -- plane and the --.
Line 27, "am" should read -- an --.

Signed and Sealed this

Seventh Day of December, 2004

JON W. DUDAS
*Director of the United States Patent and Trademark Office*

UNITED STATES PATENT AND TRADEMARK OFFICE
CERTIFICATE OF CORRECTION

PATENT NO. : 6,781,671 B2
DATED : August 24, 2004
INVENTOR(S) : Hideki Komatsuda It is certified that error appears in the above-identified patent and that said Letters Patent is hereby corrected as shown below:

Column 14,
Line 2, "radiation:" should read -- radiation; --.
Line 33, "system the," should read -- system, --.
Line 37, "plane the" should read -- plane and the --.

Column 15,
Line 27, "am" should read -- an --.

This certificate supersedes Certificate of Correction issued December 7, 2004.

Signed and Sealed this

Eighteenth Day of October, 2005

JON W. DUDAS
*Director of the United States Patent and Trademark Office*